(12) United States Patent
Cagliani et al.

(10) Patent No.: US 11,307,245 B2
(45) Date of Patent: Apr. 19, 2022

(54) METHOD FOR MEASURING AN ELECTRIC PROPERTY OF A TEST SAMPLE

(71) Applicant: KLA CORPORATION, Milpitas, CA (US)

(72) Inventors: Alberto Cagliani, Kongens Lyngby (DK); Frederik Westergaard Østerberg, Kongens Lyngby (DK); Chia-Hung Wei, Kongens Lyngby (DK)

(73) Assignee: KLA CORPORATION, Milpitas, CA (US)

( * ) Notice: Subject to any disclaimer, the term of this patent is extended or adjusted under 35 U.S.C. 154(b) by 0 days.

(21) Appl. No.: 16/753,607

(22) PCT Filed: Mar. 18, 2020

(86) PCT No.: PCT/US2020/023232
§ 371 (c)(1),
(2) Date: Apr. 3, 2020

(87) PCT Pub. No.: WO2020/205236
PCT Pub. Date: Oct. 8, 2020

(65) Prior Publication Data
US 2021/0231731 A1    Jul. 29, 2021

(30) Foreign Application Priority Data

Apr. 4, 2019  (EP) ..................................... 19167346

(51) Int. Cl.
*G01R 31/28* (2006.01)
*H01L 27/22* (2006.01)
(Continued)

(52) U.S. Cl.
CPC ....... *G01R 31/2884* (2013.01); *G01R 1/0491* (2013.01); *G01R 31/2648* (2013.01);
(Continued)

(58) Field of Classification Search
CPC ............ G01R 31/2884; G01R 31/2648; G01R 1/0491; G01R 31/2894; G11C 29/50; H01L 27/222; H01L 43/02
See application file for complete search history.

(56) References Cited

U.S. PATENT DOCUMENTS

2002/0097063 A1\* 7/2002 Kline .................. G01R 1/0416
324/750.03
2005/0172702 A1\* 8/2005 Gitis ....................... G01N 3/56
73/81

(Continued)

FOREIGN PATENT DOCUMENTS

WO        2018162343 A2    9/2018

OTHER PUBLICATIONS

WIPO, ISR for PCT/US2020/023232, dated Jul. 10, 2020.
(Continued)

*Primary Examiner* — Christopher P McAndrew
*Assistant Examiner* — Zannatul Ferdous
(74) *Attorney, Agent, or Firm* — Hodgson Russ LLP (57) ABSTRACT

The method may be used for measuring an electric property of a magnetic tunnel junction used in an embedded MRAM memory for example. The method uses a multi point probe with a plurality of probe tips for contacting a designated area of the test sample, which is electrically insulated from the part of the test sample which is to be tested. Electrically connections are placed underneath the magnetic tunnel junction and goes to the designated area.

14 Claims, 4 Drawing Sheets

(51) Int. Cl.
  *H01L 43/02* (2006.01)
  *G01R 1/04* (2006.01)
  *G01R 31/26* (2020.01)
  *G11C 29/50* (2006.01)

(52) U.S. Cl.
  CPC ............ *G11C 29/50* (2013.01); *H01L 27/222* (2013.01); *H01L 43/02* (2013.01); *G01R 31/2894* (2013.01)

(56) References Cited

U.S. PATENT DOCUMENTS

| | | | |
|---|---|---|---|
| 2005/0186793 A1* | 8/2005 | Omoto | H01L 21/76873 438/687 |
| 2008/0303140 A1* | 12/2008 | Ohtani | H01L 21/56 257/729 |
| 2014/0252356 A1* | 9/2014 | Wang | H01L 27/222 257/48 |
| 2016/0320430 A1 | 11/2016 | Zhu et al. | |
| 2017/0023617 A1 | 1/2017 | Ruffler et al. | |
| 2018/0083607 A1* | 3/2018 | Kanomata | H04L 25/03885 |
| 2019/0013140 A1* | 1/2019 | Rainer | H02M 3/155 |
| 2019/0064219 A1* | 2/2019 | Rhee | G01R 1/07342 |
| 2019/0066820 A1 | 2/2019 | Wang et al. | |
| 2019/0310295 A1* | 10/2019 | Osterberg | G01R 1/073 |

OTHER PUBLICATIONS

Kataoka et al., "Electroplating Ni micro-cantilevers for low contact-force IC probing," Sensors and Actuators A: Physical, 2003, vol. 103, pp. 116-121.

EPO, Search Report for EP Application No. 19167346.6, dated Oct. 4, 2019.

* cited by examiner

METHOD FOR MEASURING AN ELECTRIC PROPERTY OF A TEST SAMPLE

The present invention relates to measuring at least one electric property of a test sample such as a multilayer stack composed of electrically conductive layers and at least one tunnelling barrier, for example a magnetic tunnel junction (MTJ).

Typically, microscopic multi-point probes are used on for example magnetoresistive random-access memory (MRAM) wafers for current-in-plane tunnelling measurement for determining a number of electric properties of the test sample, i.e. for testing that the wafer is according to specifications.

The electric properties may be the resistance area product, the sheet resistance of a first electrically conductive sheet on top of the tunnelling barrier, the sheet resistance of a second sheet below the tunnelling barrier (bottom sheet), and the magneto tunnelling resistance.

The test sample may contain any number of tunnelling barriers and electrically conductive sheets, deposited on top of each other; in such case, multiple resistance area products may be defined. It is also possible that a sample containing more than one tunnelling barrier is modelled by a single barrier mathematical model.

The typical method of placing the multi-point probe above the wafer, and contacting the top surface of the wafer with the tips of the electrodes of the probe may result in an erroneous measurement if, for example in the case of a single tunnelling barrier model, the sheet resistance of the top sheet is lower than the sheet resistance of the bottom sheet.

It is an object of the present invention to achieve an improved measurement.

The above object and advantages together with numerous other objects and advantages, which will be evident from the description of the present invention, are according to a first aspect of the present invention obtained by:

A method for measuring an electrically property of a multilayer test sample such as a magnetic tunnel junction, said method comprising:

providing said multilayer test sample having a stack including at least a first layer and a second layer, said stack being above an electrically insulating layer, providing a first test sample terminal above said electrically insulating layer for a first connection with a measurement circuit, providing a second test sample terminal above said electrically insulating layer for a second connection with said measurement circuit, said first test sample terminal, said second test sample terminal, and said stack being electrically insulated from each other, providing a first electrically conductive path embedded in said electrically insulating layer, said first electrically conductive path electrically interconnecting said first test sample terminal and said stack, and providing a second electrically conductive path embedded in the electrically insulated layer, said second electrically conductive path electrically interconnecting said second test sample terminal and said stack, said method further comprising:

providing said measuring circuit including a first measuring terminal, and a second measuring terminal, contacting said first measuring terminal with said first test sample terminal, contacting said second measuring terminal with said second test sample terminal, and measuring said electric property of said stack by means of said measuring circuit.

The terms electric, electronic, electrically are to be understood are interchangeable.

A third test sample terminal above the electrically insulating layer for a third connection with a measurement circuit may be provided. And the third measuring terminal may be contacted with the third test sample terminal.

A fourth test sample terminal above the electrically insulating layer for a fourth connection with a measurement circuit may be provided. And the fourth measuring terminal may be contacted with the fourth test sample terminal.

Embedded means/features may be provided or embedded in, the test sample for embedded measuring of the electronic property, i.e. by embedded measuring is meant measuring the electronic property by means of features embedded in the test sample during the microfabrication of the test sample.

The embedded means may be constituted by the two terminals, and the electrically conductive paths below the stack and terminals.

The electrically insulated layer below the stack may support the stack. Similarly, the electrically insulated layer may support the test sample terminals.

The first layer may be made of an electrically conductive material, and the second layer may also be made of an electrically conductive material.

Alternatively, one of the two layers (preferably the second layer, which may be below the first layer) may be made of an electric insulator.

Each of the first layer and/or the second layer may be subdivided into multiple layers/sheets.

An electric insulator may also be sandwiched between the first layer and the second layer such that the stack is a three-layer stack—the electric insulator constituting a tunnelling barrier/layer.

The multilayer test sample may be a semiconductor wafer having multiple conductive and tunneling layers.

The multilayer test may for example be a magnetoresistive random-access memory, wherein each memory cell may be constituted by a magnetic tunnel junction—each junction may be constituted by a pillar.

There may be a high contact resistance barrier between the first (conductive) layer, and the second (conductive) layer such as Schottky barrier.

The stack may comprise the electronics for the desired purpose of the dies of the semiconductor wafer i.e. the two layers may be for a memory purpose or for a sensor purpose.

The wafer is to be understood as a substrate for microelectronic devices built in during the microfabrication process of the wafer.

The microelectronics may comprise an electronic component directed towards the desired purpose as well as circuits or components for controlling the electronic component, i.e. a memory cell and a switch for the memory cell for example.

The wafer may be fabricated by etching and/or layer growth, which may be repeated in a number of steps in a usual wafer fabrication method.

The measuring circuit may include a movable probe for moving the first measuring terminal and the second measuring terminal to the test sample such that the contact between the first measuring terminal and the first test sample terminal and also the second measuring terminal and the second test sample terminal may be established.

The first test sample terminal and second test sample terminal may each constitute a landing pad for each of the two measuring terminals, i.e. such that a measuring terminal may be brought into contact (electrically) with a test sample for a measuring terminal to land on.

Each of the first and the second test sample terminals may be manufactured during the manufacturing of the semiconductor wafer by etching each test sample terminal out as an island, i.e. etching around the area of the semiconductor wafer, which is designated the test sample terminal such that a protruding structure remains.

The etching may extend through the three-layer stack (constituting an MTJ stack for example) such that the test sample in itself has the same three layers as the rest of the wafer where there are no etchings.

Alternatively, a test sample terminal may be manufactured such that the material of the terminal is only deposited/grown in the area designated for the test sample terminal.

The test sample terminals may be positioned in the scribe lines of the test sample, i.e. the lines dividing the test sample into the respective dies having the integrated circuits constituting the electronics.

The scribe lines are typically arranged as a rectangular grid for dicing the dies, i.e. with gridlines being orthogonal.

A scribe line may have a width between 20 to 200 microns, such as 75 to 125 microns or such as 100 microns.

The test sample terminals may be made simultaneously as the electronics/integrated circuits of the dies, i.e. the area of the dies and the scribe lines is exposed with the material of the first layer in one step. In a second step, the test sample terminals may be insulated.

Thus, the first layer of a test sample terminal, and the first layer of the stack may be in the same plane.

Several test sample terminals may be placed next to each other, such as four test sample terminals. They may have a pitch (distance between them) matching the pitch of a multipoint probe for example, i.e. the second test sample terminal may be adjacent the first test sample terminal. A third test sample terminal may be placed adjacent to the second test sample terminal, and a fourth test sample terminal may, be placed adjacent to the third test sample terminal. Such four test sample terminals may be placed linearly with respect to each other, i.e. constituting a row of test sample terminals.

The electrically insulated layer supports the upper layers, and it may also be used for embedding electric wiring, i.e. electric interconnections between different parts of the wafer. Several of such metallization layers may be provided for electric interconnections through the wafer.

The electric wiring such as the first electrically conductive path and the second electrically conductive path may be manufactured during manufacturing of the wafer as copper lines deposited on the electrically insulated layer before the paths are embedded by further depositing the material of the electrically insulated layer.

Electric connections between the layers may be made by vertical vias, i.e. vias extending in a direction from one layer to another, which will be in a vertical direction when the wafer is on a horizontal surface. Thus, a first via may interconnect the first electrically conductive path with the first test sample terminal. Such vias may be made of tungsten, copper, copper nitride, tantalum, tantalum nitride, cobalt, ruthenium. Two separate vias or more may be used for establishing the vertical part of the path, which may interconnect a test sample terminal and the stack to be tested—the electrically conductive path may have two vertical parts of the path (below the test sample terminal and below the stack, respectively) and one horizontal part. Both of the vertical parts may be constituted by two or more vias instead of only one via.

The electrically insulating layer may be made of an electrically insulating material such that the electric wiring in the layer defines the circuit paths and where current may flow and the current is confined to the defined paths.

Two electrically conductive paths leading to separate test sample terminals may constitute a circuit together with the MTJ stack, for leading a supply current from a first test sample terminal to the MTJ stack and a return current back to a second test sample terminal.

According to a second aspect of the present invention the above objects and advantages are obtained by:

A multilayer test sample for embedded measuring of an electrically property of said multilayer test sample, said multilayer test sample comprising:

a stack including at least a first layer and a second layer, said stack being above an electrically insulating layer, a first test sample terminal above said electrically insulating layer for a first connection with a measurement circuit, a second test sample terminal above said electrically insulating layer for a second connection with a measurement circuit, said first test sample terminal, said second test sample terminal, and said stack being electrically insulated from each other, said multilayer test sample further comprising:

a first electrically conductive path embedded in the electrically insulated layer, said first electrically conductive path electrically interconnecting said first test sample terminal and said stack, and a second electrically conductive path embedded in the electrically insulated electrically layer, said second electrically conductive path interconnecting said second test sample terminal and said stack such that said first electrically conductive path and said second electrically conductive path together with said stack forming a circuit between said first test sample terminal and said second test sample terminal for measuring said electrically property.

The invention will now be explained in more detail below by means of examples with reference to the accompanying drawings, in which
FIG. 3b shows an enlarged view of part of FIG. 3a.
FIG. 4b shows an enlarged view of part of FIG. 4a.

The invention may, however, be embodied in different forms than depicted below, and should not be construed as limited to any examples set forth herein. Rather, any examples are provided so that the disclosure will be thorough and complete, and will fully convey the scope of the invention to those skilled in the art.

Like reference numerals refer to like elements throughout. Like elements will thus not be described in detail with respect to the description of each figure.

Figure 1:
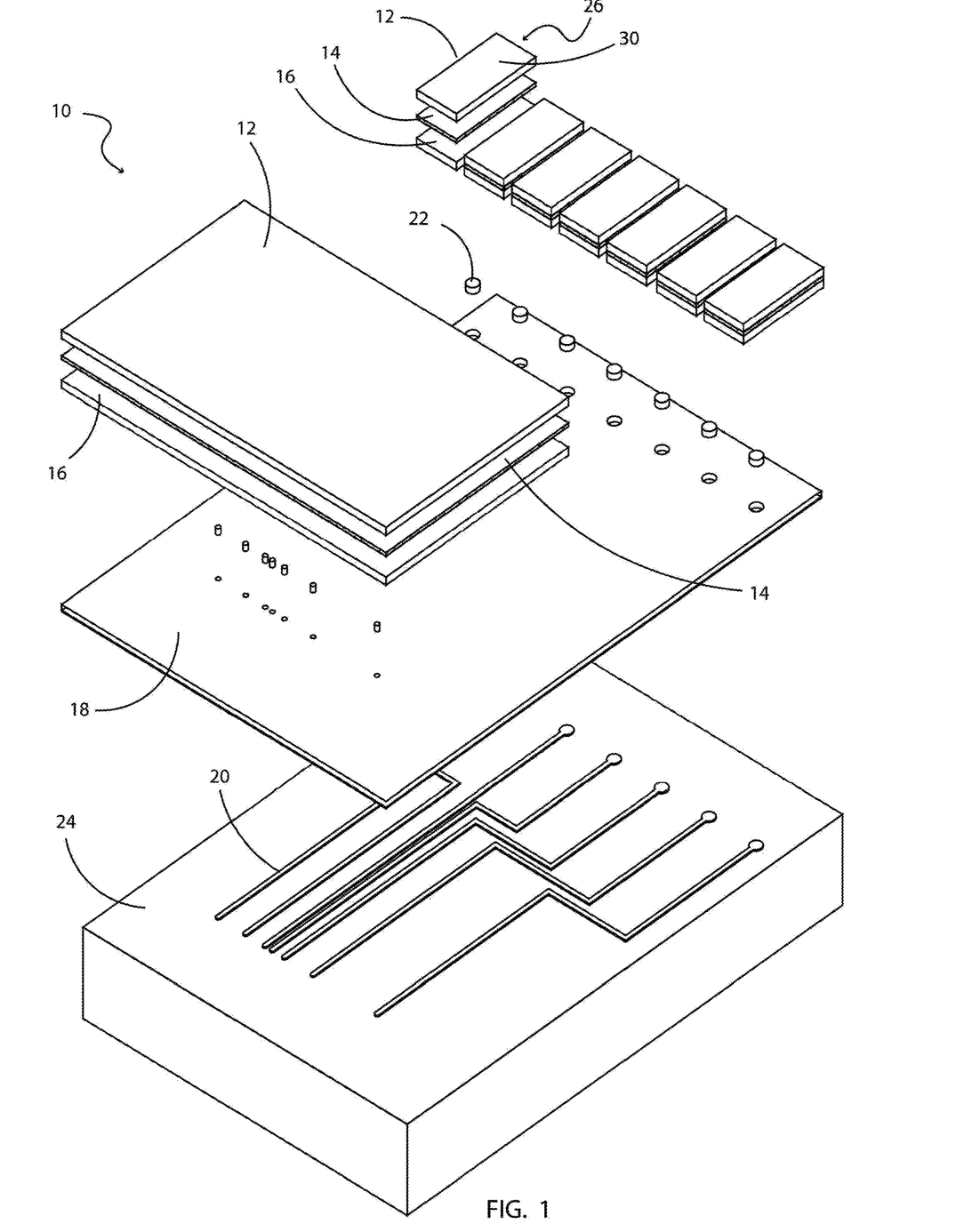
FIG. 1 shows an exploded view of a test sample.

FIG. 1 shows an exploded view of a test sample,

The test sample 10 has five layers wherein the top three layers constitute a magnetic tunnel junction (MTJ), i.e. a MTJ stack.

The test sample may constitute a semiconductor wafer comprising at least two electrically conductive layers and a tunnelling electrically insulating layer sandwiched in the middle, for example an MTJ.

The top layer 12 of the MTJ stack may or may not contain a ferromagnetic material, but it is electrically conductive.

The direction of the magnetization of the top layer may be changed.

A middle layer 14 is sandwiched between the top layer and a bottom layer 16 of the MTJ stack.

The middle layer is a thin electrically insulator—the thickness of which is not so large that electrons may not tunnel through it, i.e. the middle layer is a tunnelling barrier layer.

The bottom layer 16 may also or may not contain ferromagnetic materials, but it is electrically conductive.

Alternatively, the top layer may have a permanent magnetization, and the bottom layer may have a variable direction of the magnetic moments. Both layers may also have a variable direction of the magnetic moments.

The resistance of the stack when a voltage potential is applied across the stack could depend on if the magnetization of the top and bottom layer are parallel or antiparallel, i.e. if they are parallel, the tunnelling barrier is lower than if the magnetizations are antiparallel.

The top layer is illustrated with a planar top surface, and the layers are in general illustrated as being parallel to each other.

The stack may also have more than two conductive layers and one barrier with several electrical properties, which are to be measured.

Alternatively, the layers of the test sample may have another function than as for a MRAM cell. For example, a stack having only two layers, the purpose of which being a sensor.

The three layers of the stack are shown as seven islands in FIG. 1, i.e. six smaller islands next to each other on a row and one larger island by itself (such as a test island constituting an MTJ stack 28 for MRAM or a sensor purpose). This is a result of etchings in the stack layers such that these islands become electrically insulated from each other, i.e. the islands are not electrically connected with each other.

The removed parts of the layers could also be constituted by oxide material or another material constituting an electrical insulator, i.e. such that the space between the islands themselves, and the space between an island and the MTJ stack is filled with an electrical insulator material.

The six smaller islands constitute six test sample terminals, which may have the purpose of landing pads such as a first landing pad 26 having a first landing area on top of the landing pad, i.e. the exposed surface 30 which is not covered by another layer on top of it—except for possibly a thin oxide layer.

A test sample terminal may have any in-plane shape. FIG. 1 shows rectangular shapes/areas but the shape may be round, oval, elliptic, polygonal or a random shape.

Each landing area of each landing pad is for landing a probe tip, i.e. contacting a probe tip with the landing area such that an electric signal may be injected into the landing pad during a measurement routine, or alternatively, an electric measurement signal may be picked up. In this way, terminals are provided on the test sample for a probe, and for doing a probe measurement.

Instead of using a probe, the test sample may be inserted into a measuring device wherein the measuring terminals have fixed positions aligned with the position of the test sample terminals when the test sample is placed correctly in the measuring device.

The larger island 28 may the identical as of the in the MRAM cell needed to be tested, specifically one or more electrical properties of the MTJ stack.

Below the MTJ stack is a fourth layer constituting a first electrically insulating layer 18, i.e. no current is intended to flow freely in that layer without control of the current path.

Below the fourth electrically insulating layer is the fifth layer constituting a second electrically insulating layer 20.

The first electrically insulating layer, and the second electrically insulating layer may be made as one electrically insulating layer.

The first electrically insulating layer has vias such as a first via 22 extending vertically throughout the thickness of the layer.

One via is illustrated below each of the six islands constituting a row of islands.

Six vias, such as a second via 34, are also shown under the larger island, which all go into contact with the bottom surface of the bottom layer of the MTJ stack.

In the second electrically insulating layer are six cobber lanes, i.e. cobber deposited during one of the fabrication steps (another electrically conductive material than cobber may be used).

The cobber lanes constitute electrically conductive paths such as a first electrically conductive path 24.

For the electric connection between a terminal and the particular part of the test sample, which needs to be tested, it is contemplated that the vias may be omitted. For example if a test sample terminal and test island are next to each other so that the electric connection only needs to be established underneath the isolated/etched part of the test sample.

The electrically conductive paths extend parallel with the layers and each electrically conductive path interconnects a via for one landing pad with one of the vias contacting the MTJ stack.

One of the electrically insulating layers may also be used for electrically connections leading to for example control electronics such as a switch. The switch itself may be placed in a sixth layer, which may be lower than the electrically insulating layer.

A landing pad may not necessarily be constituted by three MTJ layers. Alternatively, the landing pad may be a semiconductor material deposited or otherwise created on the first electrically insulating layer as an island which may conduct an electric signal from a probe tip to the via, which contacts the respective landing pad from below.

Figure 2:
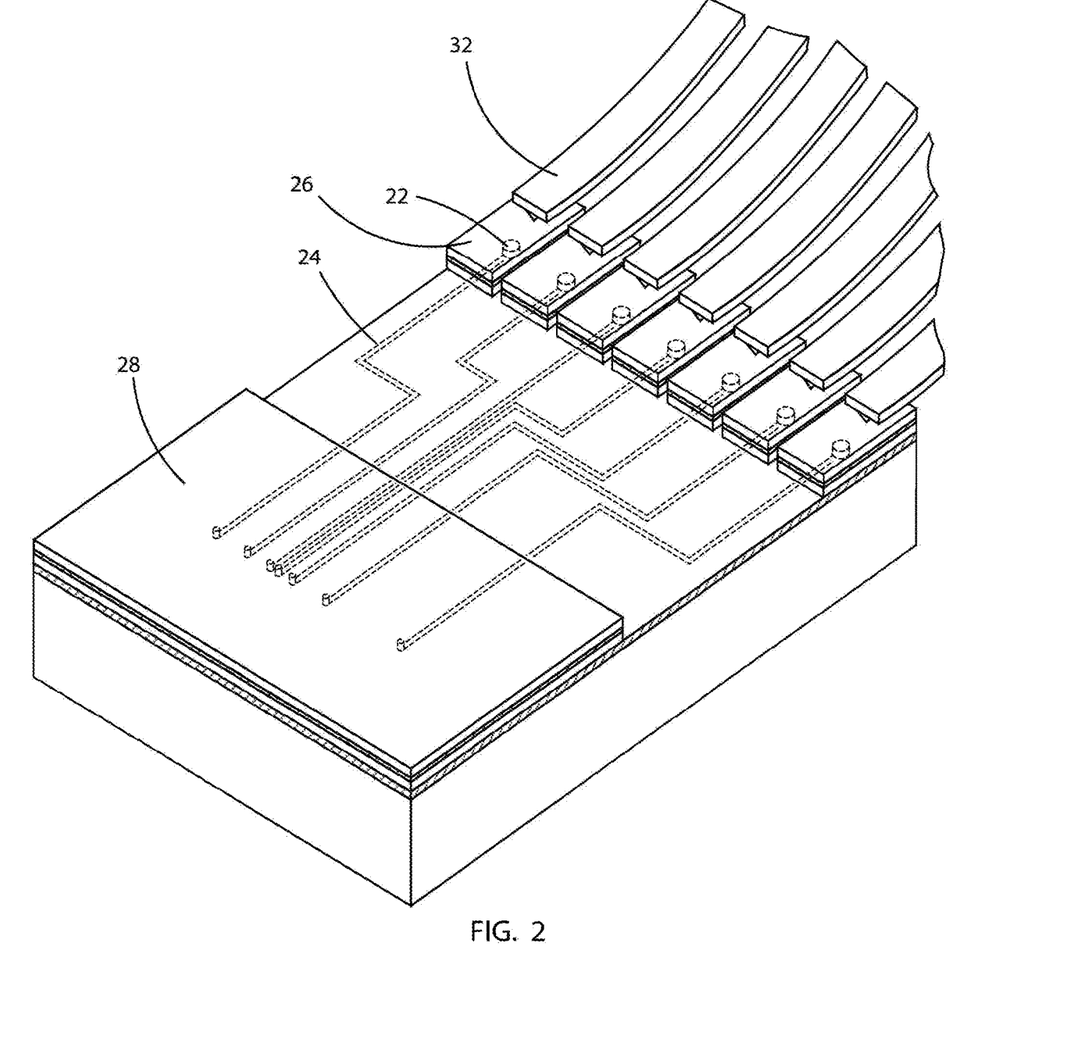
FIG. 2 shows a test sample.

FIG. 2 shows a test sample.

The test sample in FIG. 2 corresponds to the test sample mentioned in connection with FIG. 1, but where a probe has been placed above the test sample.

The test sample is shown in a non-exploded view. The vias and electrically conductive paths are illustrated as dotted lines below the top three layers.

The probe has six cantilever arms extending parallel to each other. Each cantilever arm ending in a probe tip such as a first probe tip 32.

Each respective probe tip has been brought into contact with the landing areas of each respective landing pad, i.e. the first probe tip 32 contacts the first landing pad 26 with the first via 22 contacting the first landing pad from below.

For the measurement of the electric property, the contact is such that there is an electric contact between the probe tip and the landing pad, i.e. the probe tip may penetrate a possible oxide layer on top of the landing pad such that the electric contact may be established.

A probe tip may penetrate the landing pad a small distance so that it not only rests on the surface constituting the landing area.

The first electrically conductive path extends from the first via to the MTJ stack 28, i.e. to a point below the MTJ stack.

The vias and electrically conductive paths enable a circuit path to be completed from one probe tip to another such that a current may be injected into the circuit path and go into the MTJ stack and further to a second probe tip.

Four of the cantilever arms may be for a four point measurement (four terminal sensing). Two of these are for injecting a current, and the other two are for voltage measurement.

The fifth cantilever arm may be for distance measuring so that the distance between a probe tip and landing pad may be controlled during the landing of a probe tip.

Figure 3A:
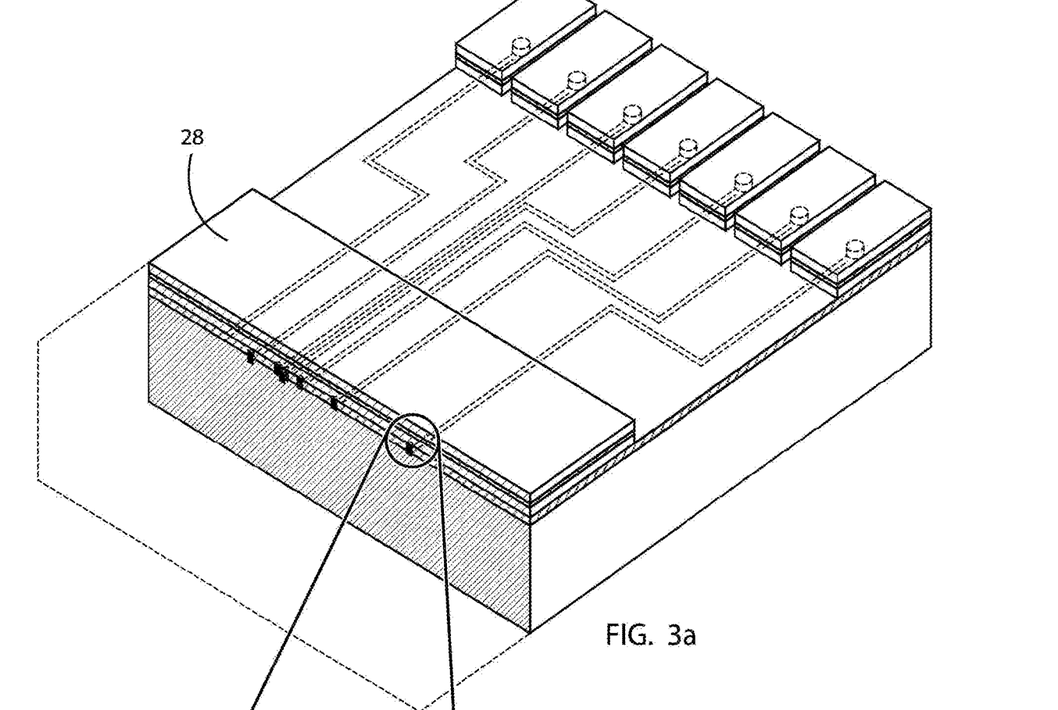
FIG. 3a shows a test sample.

FIG. 3a shows a test sample.

The test sample in FIG. 3a corresponds to the test sample mentioned in connection with FIG. 1, but where a cross section has been made through the vias which connects to the MTJ stack to be tested.

Figure 3B:
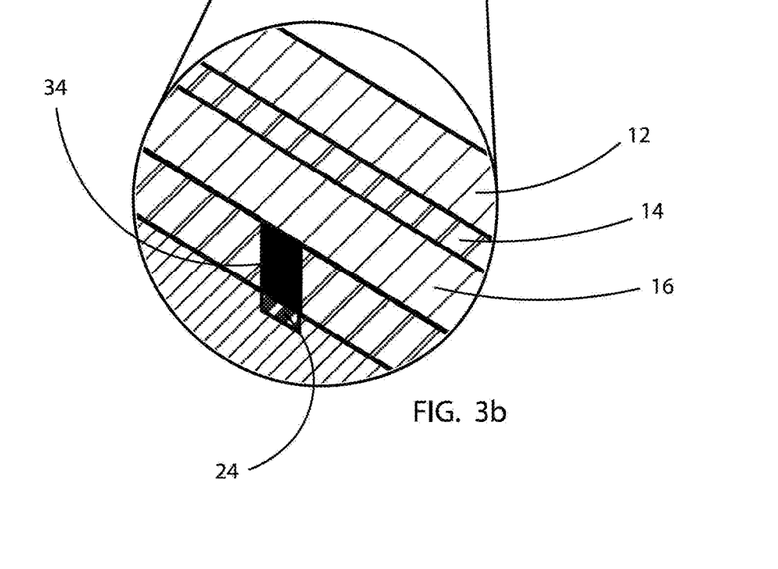

In FIG. 3b, an, enlarged view of one of the vias in FIG. 3a is shown, i.e. of a part of the test sample shown in FIG. 3a.

The magnified view shows the top layer 12, the middle layer 14, and the bottom layer 16 of the MTJ stack. The second via 34 extends vertically from the first electrically conducting path 24 to the bottom layer 16 of the MTJ stack 28.

Figure 4A:
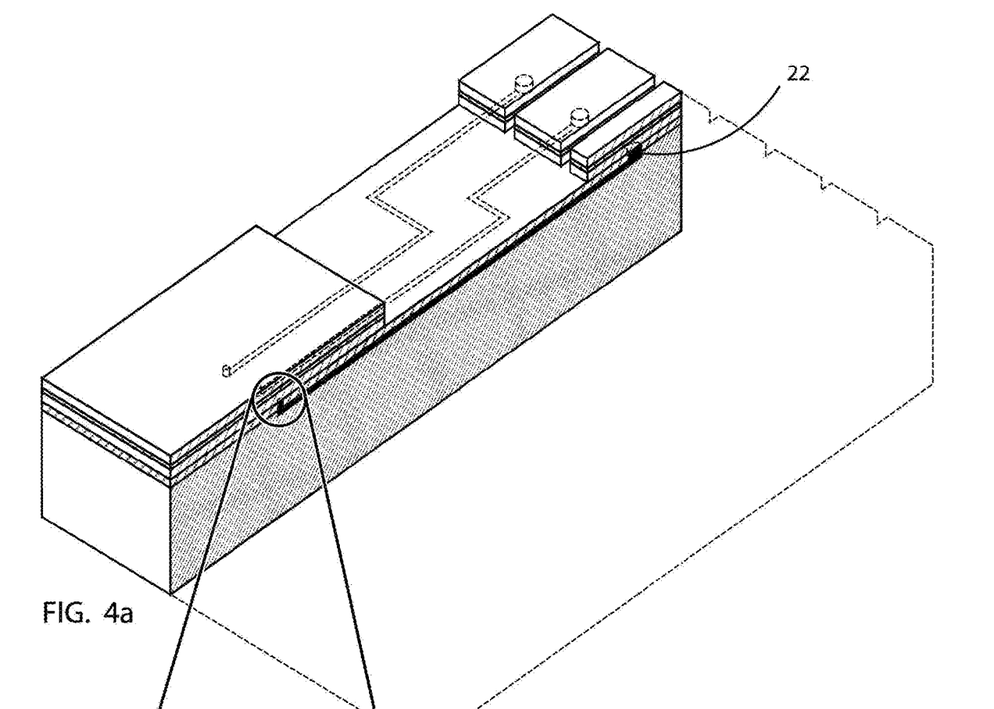
FIG. 4a shows a test sample.

FIG. 4a shows a test sample.

The test sample in FIG. 4a corresponds to the test sample mentioned in connection with FIG. 1, but where a cross section has been made through one of the electrically conductive paths—the cross section is in a plane orthogonal to the cross section of FIG. 3b.

Figure 4B:
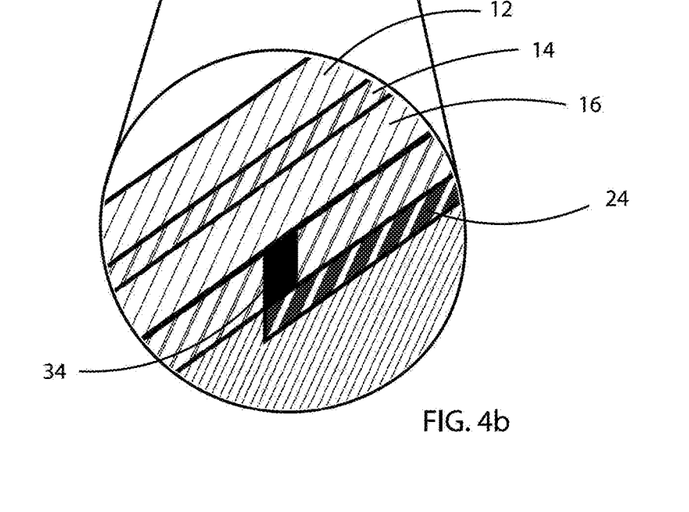

In FIG. 4b, an enlarged view of one of the vias in FIG. 4a is shown, i.e. of a part of the test sample shown in FIG. 4a.

The magnified view shows the top layer 12, the middle layer 14, and the bottom layer 16 of the MTJ stack.

The second via 34 extends vertically from the first electrically conducting path 24 to the bottom layer 16 of the MTJ stack 28.

The electrically conducting path 24 extends between the first via 22 and the second via 34.

Below is a list of reference signs used in the detailed description of the invention and in the drawings referred to in the detailed description of the invention
10 Test sample
12 Top layer
14 Middle layer
16 Bottom layer
18 First electrically insulating layer
20 Second electrically insulating layer
22 First via
24 First electrically conductive path
26 First landing pad
28 MTJ stack
30 First landing area
32 Probe tip
34 Second via

The invention claimed is:

1. A method for measuring an electrical property of a multilayer test sample such as a magnetic tunnel junction, said method comprising:
providing said multilayer test sample having a stack including at least a first layer and a second layer, said stack being above an electrically insulating layer,
providing a first test sample terminal above said electrically insulating layer for a first connection with a measurement circuit,
providing a second test sample terminal above said electrically insulating layer for a second connection with said measurement circuit,
said first test sample terminal, said second test sample terminal, and said stack being electrically insulated from each other,
providing a first electrically conductive path embedded in said electrically insulating layer, said first electrically conductive path electrically interconnecting said first test sample terminal and said stack, and
providing a second electrically conductive path embedded in the electrically insulated layer, said second electrically conductive path electrically interconnecting said second test sample terminal and said stack,
said method further comprising:
providing said measuring circuit including a first measuring terminal and a second measuring terminal,
contacting said first measuring terminal with said first test sample terminal,
contacting said second measuring terminal with said second test sample terminal, and
measuring said electric property of said stack by means of said measuring circuit.

2. The method according to claim 1, said multilayer test sample being a semiconductor wafer for magnetoresistive random-access memory.

3. The method according to claim 1, said stack constituting a magnetic tunnel junction.

4. The method according to claim 1, said first layer being a ferromagnetic sheet.

5. The method according to claim 1, said second layer being a ferromagnetic sheet.

6. The method according to claim 1, said stack including a middle layer sandwiched between said first layer and said second layer.

7. The method according to claim 6, said middle layer being an electric insulator for tunnelling electrons between said first layer and said second layer.

8. The method according to claim 1, a first island of said test sample having at least three layers.

9. The method according to claim 8, a second island of said test sample having at least three layers.

10. The method according to claim 1, said first electrically conductive path extending planarly in said electrically insulating layer.

11. The method according to claim 1, comprising providing a first via between said first test sample and said first electrically conductive path.

12. The method according to claim 11, comprising providing a second via between said stack and said first electrically conductive path.

13. The method according to claim 1, comprising providing a test probe including a first probe tip of said first measuring terminal and a second probe tip of said second measuring terminal,
contacting said first probe tip with said first test sample terminal, and
contacting said second probe tip with said second test sample terminal.

14. A multilayer test sample for embedded measuring of an electrical property of said multilayer test sample, said multilayer test sample comprising:
a stack including at least a first layer and a second layer, said stack being above an electrically insulating layer, a first test sample terminal above said electrically insulating layer for a first connection with a measurement circuit, a second test sample terminal above said electrically insulating layer for a second connection with said measurement circuit, said first test sample terminal, said second test sample terminal, and said stack being electrically insulated from each other, said multilayer test sample further comprising:

a first electrically conductive path embedded in the electrically insulated layer, said first electrically conductive path electrically interconnecting said first test sample terminal and said stack, and a second electrically conductive path embedded in the electrically insulated layer, said second electrically conductive path interconnecting said second test sample terminal and said stack such that said first electrically conductive path and said second electrically conductive path together with said stack form a circuit between said first test sample terminal and said second test sample terminal for measuring said electrically property.

\* \* \* \* \*